(12) United States Patent
Fukuhara et al.

(10) Patent No.: US 6,553,396 B1
(45) Date of Patent: Apr. 22, 2003

(54) FILTER BANK CONSTITUTING METHOD AND FILTER BANK APPARATUS

(75) Inventors: Takahiro Fukuhara, Kanagawa (JP); Seiji Kimura, Chiba (JP); Hitoshi Kiya, Tokyo (JP); Hiroyuki Kobayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/457,822

(22) Filed: Dec. 9, 1999

(30) Foreign Application Priority Data

Feb. 23, 1999 (JP) .......................................... 11-045556

(51) Int. Cl.$^7$ ............................................... G06F 17/10

(52) U.S. Cl. ........................................ 708/313; 708/300

(58) Field of Search ................................. 708/313, 300

(56) References Cited

U.S. PATENT DOCUMENTS

| | | | | |
|---|---|---|---|---|
| 5,420,891 A | * | 5/1995 | Akansu | 375/229 |
| 5,548,542 A | * | 8/1996 | Rauth et al. | 708/313 |
| 5,841,681 A | * | 11/1998 | Chen et al. | 324/76.31 |
| 6,182,102 B1 | * | 1/2001 | Ramachandran et al. | 708/308 |

* cited by examiner

Primary Examiner—David H. Malzahn
(74) Attorney, Agent, or Firm—Frommer Lawrence & Haug LLP; William S. Frommer; Dennis M. Smid

(57) ABSTRACT

A method and apparatus for constructing a filter bank designed to split the frequency spectrum of digital signals into plural bands. Specifically, a low-pass analysis filter unit ($H_0(z)$), adapted to pass frequency components of an input signal not higher than a pre-set frequency, is determined by a high-pass analysis filter unit ($H_1(z)$) passing frequency components of the input signal not less than the pre-set frequency and a phase-linear filter unit ($f(z)$) having phase-linear characteristics. This enables efficient wavelet splitting of the input signal.

30 Claims, 8 Drawing Sheets

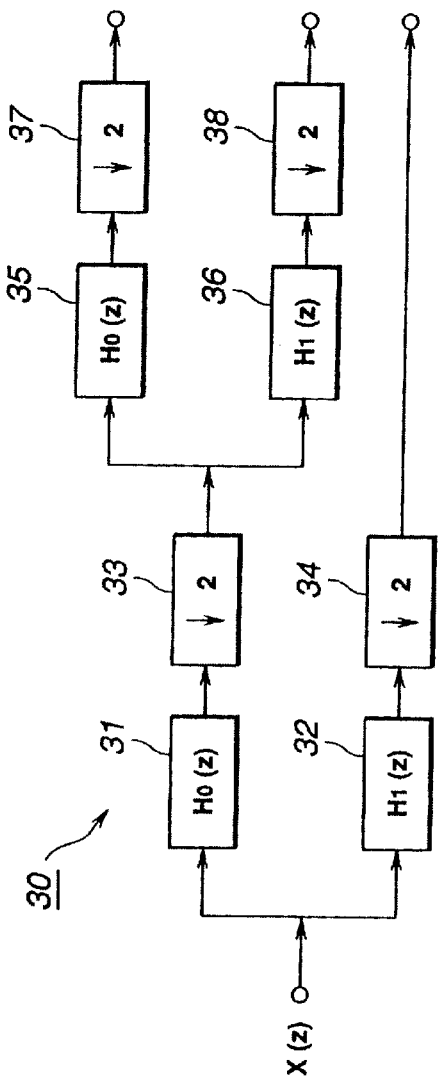
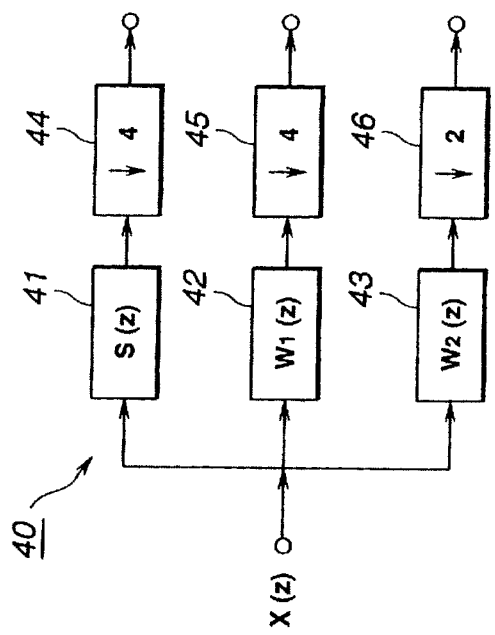
FIG.2A (PRIOR ART)
FIG.2B (PRIOR ART)

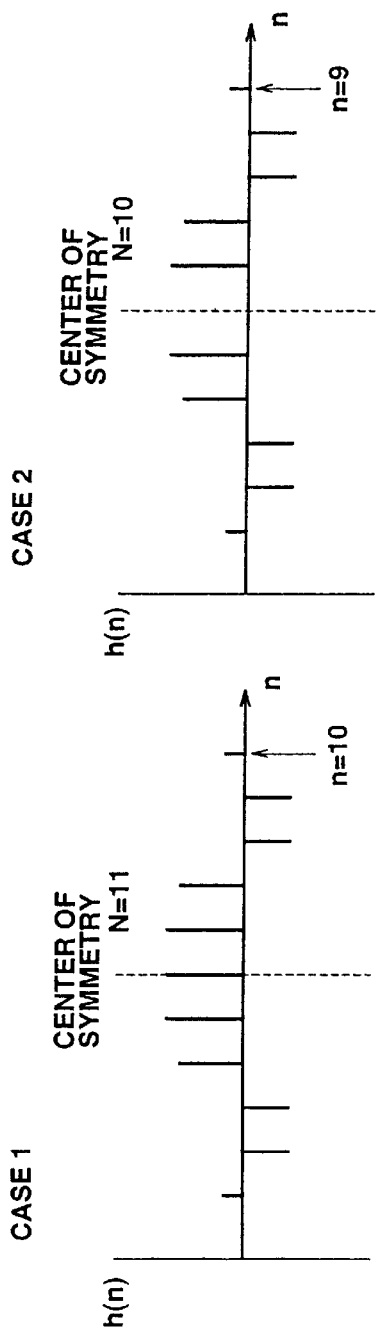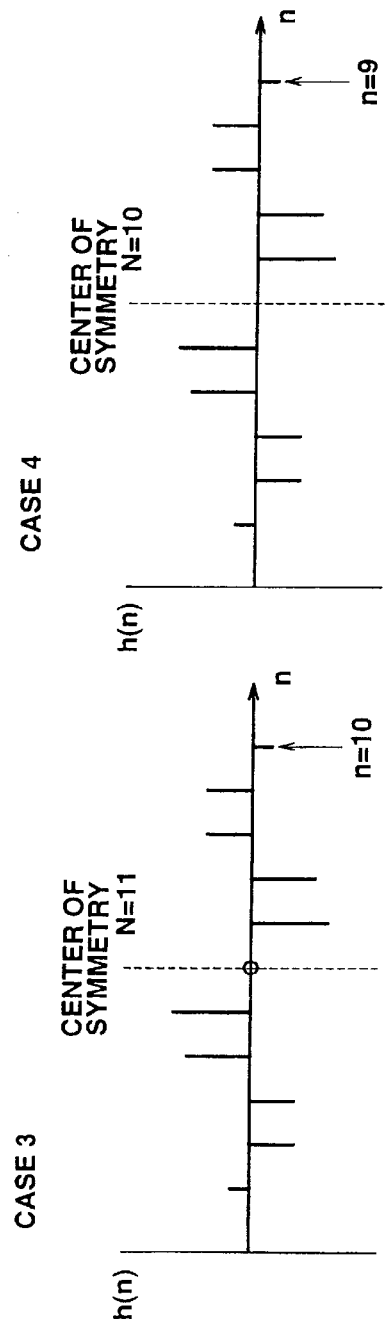

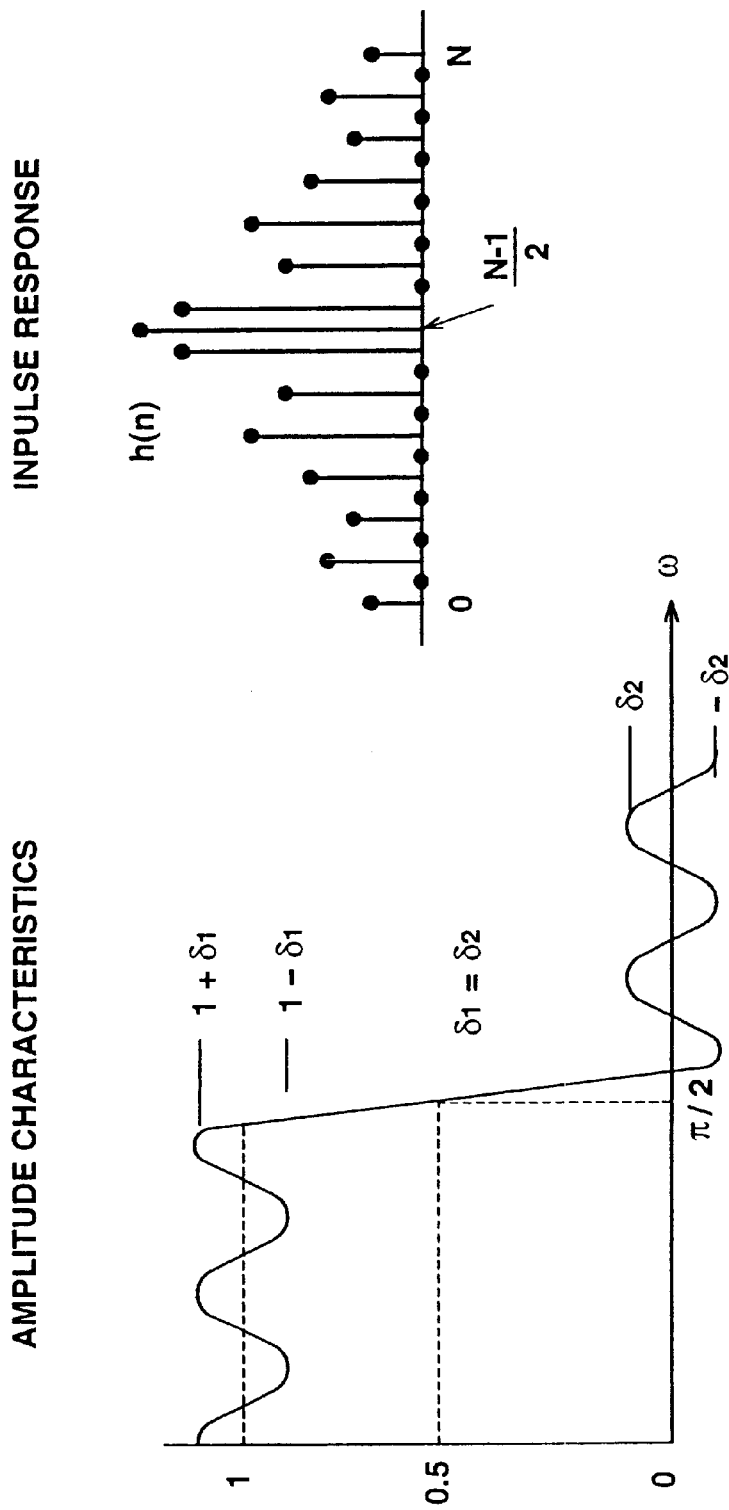

FILTER BANK CONSTITUTING METHOD AND FILTER BANK APPARATUS

BACKGROUND OF THE INVENTION

1. Field of the Invention

This invention relates to a method for constructing a filter bank used for efficiently band-splitting digital signals, and a filter bank apparatus constructed by this method.

2. Description of the Related Art

Among conventional illustrative picture compression systems, there is the Joint Photographic Experts Group (JPEG) system standardized by the International Organization for Standardization (ISO). This JPEG system uses discrete cosine transform (DCT) as a transform system and is able to furnish good encoded or decoded images subject to allocation of a larger number of bits. However, if the number of bits is reduced to a more or less extent, block distortion proper to DCT appears significantly on encoded or decoded images, such that subjective deterioration in the image quality becomes outstanding.

In distinction from these systems, investigations are going on briskly in connection with systems configured for splitting image signals into plural bands by a filter device combined from high-pass filters and low-pass filters, known as a filter bank, and for carrying out encoding from one band to another. Among these systems, wavelet transform has no defect that block distortion becomes outstanding for high compression in contradistinction from DCT and, for this reason, wavelet transform is felt to prove a promising technique which possibly takes the place of DCT.

At present, in an electronic still camera or video movie, the International Standard system, exemplified by JPEG or the Moving Picture Experts Group (MPEG), is accepted as a picture compression system, and DCT is used as the transform system which operates as a key for compression.

Researches towards improving the efficiency of the encoding system, founded on the wavelet transform, and which possibly takes the place of DCT-based encoding system, are conducted energetically in many research institutes. As an international standard system for the next-generation still picture compression system, which may be said to follow the suit of JPEG, there is the JPEG-2000, for which investigations are proceeding by the ISO/IEC/JTC1/SC29/WG1, which is the same organization as JPEG. In this JPEG-2000, wavelet transform is scheduled to be accepted in place of the routinely used DCT in JPEG as the transform system which is to be the basis of image compression.

Meanwhile, the wavelet transform is the system in which image signals are split into plural bands by a filter device, termed a filter bank, combined from high-pass filters and low-pass filters. However, there has not been known at present means for efficiently constructing this filter bank. For implementing an encoding system which is founded on wavelet transform, the necessity for establishing means for constructing the filter bank enabling efficient band splitting of a variety of image signals is felt to be increasing in future, such that there is an increasing demand for the means for constructing the filter bank.

SUMMARY OF THE INVENTION

It is therefore an object of the present invention to provide a method for constructing the filter bank efficiently. It is another object of the present invention to provide a filter bank apparatus constructed by this filter bank constructing method.

In one aspect, the present invention provides a filter bank constructing method and apparatus for constructing a band-splitting filter bank for splitting the spectrum of an input signal into a high frequency range and a low frequency range, in which low-pass analysis filter means($H_0(z)$), adapted for passing frequency components of the input signal not higher than a pre-set frequency, is determined by high pass analysis filter means ($H_1(z)$), adapted for passing frequency components of the input signal not lower than the pre-set frequency, and by phase-linear filter means ($f(z)$) having phase linear characteristics.

In the filter bank constructing method and apparatus, according to the present invention, the low-pass analysis filter means is determined by determining the high pass analysis filter means and by the phase-linear filter means.

In another aspect, the present invention provides a method and apparatus for constructing a splitting filter bank in which a first signal obtained on downsampling an input signal (even-numbered component signal) is inputted to prediction filter means ($P(z)$), a second signal obtained on downsampling the input signal (odd-numbered component signal) and a prediction signal generated by the prediction filter means are inputted to subtraction means to generate a difference signal which is outputted as a high range component output signal, an updated signal generated on inputting the difference signal to updating filter means ($U(z)$) is summed to the first signal by summing means to output the sum signal as a low range component output signal. The prediction filter means is determined by phase-linear low-pass filter means having an odd number of orders of the filter coefficients ($H_1'(z)$) and an even-number symmetrical impulse response, and the updating filter means is determined by phase-linear filter means having linear phase characteristics ($f(z)$).

In the method and apparatus for constructing a splitting filter bank, according to the present invention, the prediction filter means and the updating filter means are determined by determining the phase-linear low-pass filter means and the phase-linear filter means, respectively.

In still another aspect, the present invention provides a filter bank constructing method and apparatus for constructing a synthesis filter bank which is fed with low-range signals and high-range signals split respectively by low-pass analysis filter means adapted for passing frequency components of original signals not higher than a pre-set frequency ($H_0(z)$) and by high-pass analysis filter means adapted for passing frequency components of the original signals not lower than a pre-set frequency $H_1(z)$), and which synthesizes the low-range signals and high-range signals. The low-pass synthesis filter means, fed with the low-range signals and adapted for passing frequency components not higher than a pre-set frequency ($F_0(z)$), is determined by the high-pass analysis filter means, and the high-pass synthesis filter means, fed with the high-range signals and adapted for passing frequency components not lower than a pre-set frequency ($F_1(z)$), is determined by the low-pass analysis filter means.

In the method and apparatus for constructing a splitting filter bank, according to the present invention, the low-pass synthesis filter means is determined based on the determined high-pass analysis filter means, whilst the high-pass synthesis filter means is determined based on the determined low-pass analysis filter means.

In yet another aspect, the present invention provides a filter bank constructing method and apparatus for constructing a synthesis filter bank in which a low-range component output signal, obtained on splitting an original signal, and a high-range component output signal, obtained on splitting the original signal, are inputted to updating filter means (U(z)), to yield an updated signal, which updated signal is inputted along with the low-range component output signal to subtraction means to yield a difference signal, which difference signal is inputted to prediction filter means P(z)) to yield a prediction signal, which prediction signal and the high-range component output signal are suited together by first summing means to yield a sum signal, which sum signal is suited to the difference signal by second summing means and outputted as an output signal. The prediction filter means is determined by phase-linear low-pass filter means having an odd number of orders of the filter coefficients and even-number symmetrical impulse response ($H_1'(z)$), and the updating filter means is determined by phase-linear filter means having phase-linear characteristics ((f(z)).

In the method and apparatus for constructing a splitting filter bank, according to the present invention, the prediction filter means is determined by determining the phase-linear low-pass filter means, whilst the updating filter means is determined by determining the phase-linear filter means.

In the method and apparatus for constructing a splitting filter bank, according to the present invention, the low-pass analysis filter means($H_0(z)$), adapted for passing frequency components of the input signal not higher than a pre-set frequency, can be efficiently determined by the high pass analysis filter means ($H_1(z)$), adapted for passing frequency components of the input signal not lower than the pre-set frequency, and by phase-linear filter means (f(z)) having phase linear characteristics, thus enabling the input signal to be wavelet-split efficiently.

Also, in the method and apparatus for constructing a splitting filter bank, according to the present invention, the prediction filter means (P(z)) for generating prediction signals in a lifting configuration can be efficiently determined by determining phase-linear low-pass filter means ($H_1'(z)$) having an odd number of orders of the filter coefficients and an even-number symmetrical impulse response. Moreover, the updating filter means (U(z)) for generating updating signals in the lifting configuration can be determined efficiently by determining the phase-linear filter means (f(z)) having phase-linear characteristics, thus enabling the updating filter means (U(z)) generating updated signals in the lifting configuration to be determined efficiently.

Moreover, in the method and apparatus for constructing a splitting filter bank, according to the present invention, the low-pass synthesis filter means ($F_0(z)$), adapted to pass frequency components of input low-range signals not larger than a pre-set frequency, can be automatically determined by determining high-pass analysis filter means ($H_1(z)$), adapted for passing frequency components of the original signal not less than a pre-set frequency, whilst the high-pass synthesis filter means ($F_1(z)$), adapted to pass frequency components of input high-range signals not larger than a pre-set frequency, can be automatically determined by determining low-pass analysis filter means ($H_0(z)$), adapted for passing frequency components of the original signal not larger than the pre-set frequency, thus enabling wavelet synthesis.

In addition, in the method and apparatus for constructing a splitting filter bank, according to the present invention, the prediction filter means (P(z)), adapted for generating prediction signals in the lifting configuration, can be easily determined by determining the phase-linear low-pass filter means ($H_1'(z)$) having an odd number of orders of filter coefficients and even-number symmetry of the impulse response, whilst the updating filter means (U(z)), adapted for generating updating signals in the lifting configuration, can be easily determined by determining the phase-linear filter means (f(z)) having phase-linear characteristics.

BRIEF DESCRIPTION OF THE DRAWINGS

FIGS. 2A and 2B are block diagrams for illustrating an analytic filter bank for 2-stage wavelet splitting and a parallel filter bank representing an equivalent structure of this analytic filter bank.

FIGS. 4A, 4B, 4C, and 4D illustrate conditions for a phase-linear filter and specifically showing the impulse response of the phase-linear filter.

FIGS. 5A and 5B illustrate a half-band filter and specifically showing amplitude characteristics and the impulse response in the half-band filter.

DESCRIPTION OF THE PREFERRED EMBODIMENTS

Figure 1:
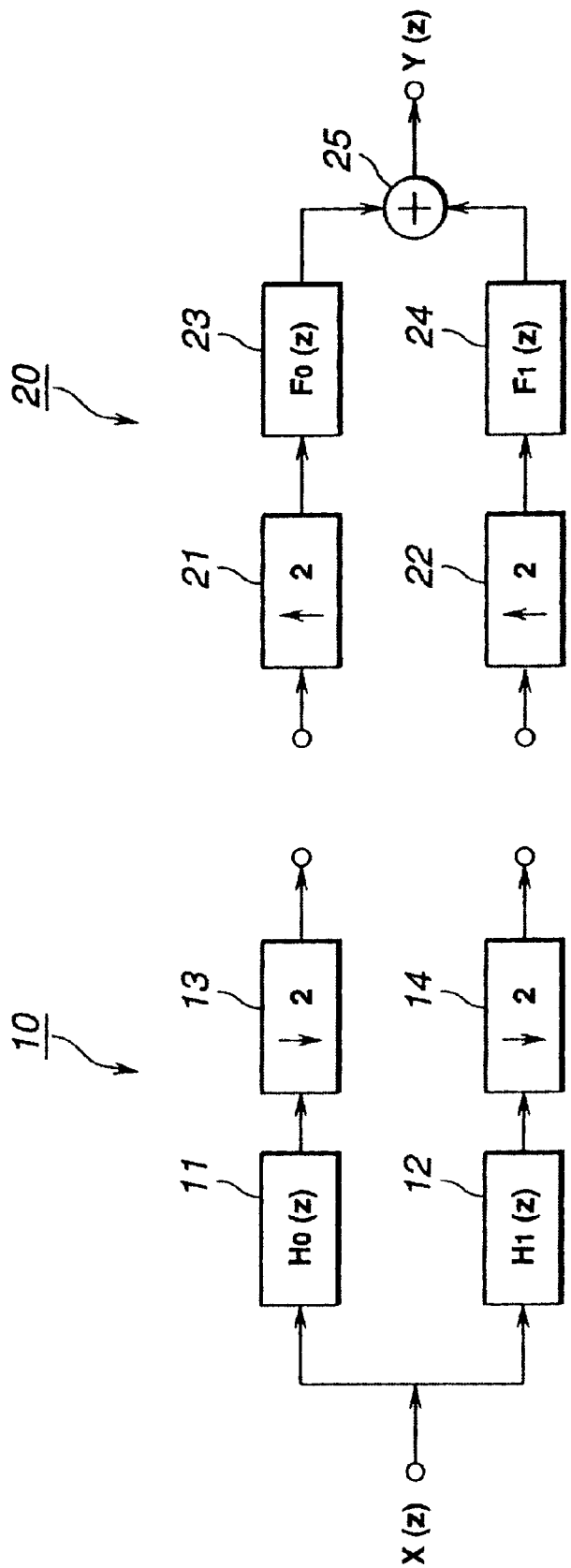
FIG. 1 is a block diagram for illustrating a most fundamental 2-stage splitting filter bank embodying the present invention.

Referring to the drawings, a preferred embodiment of the present invention will be explained in detail.

The preferred embodiment of the present invention is directed to a band splitting filter bank used for splitting image signals into plural bands. Before proceeding to detailed explanation, a band-splitting filter bank in general is explained.

As the most representative band-splitting filter bank, there is a two-stage splitting filter bank, schematics of which are explained in, for example, "Nishi Takaya, Multi-Rate Signal Processing, published by SHOKO-DO". This two-stage splitting filter bank is classified into a two-stage splitting analysis filter bank 10 and a two-stage synthesis filter bank 20, as shown in FIG. 1.

The two-stage splitting analysis filter bank 10 is made up of a low-pass analysis filter ($H_0(z)$) 11, as means for low-pass analysis filter means for passing frequency components not higher than a pre-set frequency of an input signal X(z), a high-pass analysis filter ($H_1(z)$) 12, as high pass analysis filter means for passing frequency components not lower than a pre-set frequency of the input signal X(z), a downsampler 13, as first downsampling means for downsampling the low-range signals having passed through the low-pass analysis filter 11 by ½, and a downsampler 14, as second downsampling means for downsampling the high range signals having passed through the high-pass analysis filter 12 by ½.

This two-stage splitting analysis filter bank 10 splits the spectrum of the input signal X(z) into high-range components and low-range components to output low-range signals and high-range signals, both downsampled by ½.

On the other hand, the two-stage synthesis filter bank 20 has various units operating as the two-stage splitting analysis filter bank 10. That is, the two-stage synthesis filter bank 20 includes an upsampler 21, as first upsampling means fed with downsampled low-range signals and which is adapted to upsample the input signal by two, and an upsampler 22, as second upsampling means fed with downsampled high-range signals and which is adapted to upsample the input signal by two. The two-stage synthesis filter bank 20 also includes a low-pass synthesis filter ($F_0(z)$) 23, as low-pass synthesis filter means, adapted to pass frequency components of upsampled low-range signals from the upsampler 21 which are not higher than a pre-set frequency, and a high-pass synthesis filter ($F_1(z)$) 24, as high-pass synthesis filter means, adapted to pass frequency components of upsampled high-range signals from the upsampler 22 which are not lower than a pre-set frequency. The two-stage synthesis filter bank 20 further includes an adder 25, as means for summing low-pass synthesized signals from the low-pass synthesis filter 23 and high pass synthesized signals from the high-pass synthesis filter 24.

This two-stage synthesis filter bank 20 has the function of restoring an output signal $Y(z)$, equivalent to the original input signal $X(z)$, from the downsampled low-range signals and downsampled high-range signals, obtained on splitting by, for example, the two-stage splitting analysis filter bank 10. The input/output signals are related to each other by the following equation (1):

$$Y(z)=\tfrac{1}{2}[H_0(z)F_0(z)+H_1(z)F_1(z)]X(z)+\tfrac{1}{2}[H_0(-z)F_0(z)+H_1(-z)F_1(z)]X(-z) \quad (1)$$

The band-splitting analysis filter bank also can split picture signals into two or more bands, using two-stage splitting analysis filter banks. This band-splitting analysis filter bank may be exemplified by an analysis filter bank 30, which splits the low range in a tree pattern, using two stages of two-stage splitting analysis filter banks, as shown for example in FIG. 2A.

This analysis filter bank 30 includes a low-pass analysis filter ($H_0(z)$) 31, for passing frequency components of the input signal $X(z)$ not higher than a pre-set frequency, and a high-pass analysis filter ($H_1(z)$) 32, for passing frequency components of the input signal $X(z)$ not lower than a pre-set frequency. The analysis filter bank 30 also includes downsamplers 33, 34 for downsampling low-range signals and high-range signals which have passed through the low-pass analysis filter 31 and the high-pass analysis filter 32, respectively. The analysis filter bank 30 also includes a low-pass analysis filter ($H_0(z)$) 35 for passing frequency components of the downsampled low-range signals from the downsampler 33 not higher than a pre-set frequency. The analysis filter bank 30 also includes a high-pass analysis filter ($H_1(z)$) 36 for passing frequency components of the downsampled low-range signals from the downsampler 33 not lower than a pre-set frequency. The analysis filter bank 30 further includes downsamplers 37, 38 for downsampling by ½ the low-range signals and high-range signals from the low-pass analysis filter 35 and the high-pass analysis filter 36, respectively.

This analysis filter bank 30 outputs downsampled high-range signals of the downsampled low-range and high-range signals obtained on splitting the input signal $X(z)$ into high-range signals and low-range signals and on subsequently downsampling the high-range and low-range signals by ½. The analysis filter bank 30 also splits the band of the low-range signals, downsampled by ½, into high-range and low-range signals, to output low-range signals and high-range signals, both downsampled by ¼.

The analysis filter bank 30, having such tree-like structure, may be expressed by an equivalent configuration, using a parallel filter bank 40, shown in FIG. 2B.

The parallel filter bank 40 is made up of filters 41, 42, 43 ($S(z)$, $W_1(z)$ and $W_2(z)$), for passing frequency components of pre-set ranges, downsamplers 44, 45 for downsampling output signals of the filters 41, 42 by ¼, and a downsampler 46 for downsampling output signals of the filter 43 by one-half.

The analysis filter bank 30 can also be expressed by an equivalent configuration employing such parallel filter bank 40, $S(z)$. Therefore, $W_1(z)$ and $W_2(z)$ may be expressed by the following equations (2), (3) and (4), respectively:

$$S(z)=H_0(z)H_0(z^2) \quad (2)$$

$$W_1(z)=H_0(z)H_1(z^2) \quad (3)$$

$$W_2(z)=H_1(z) \quad (4)$$

It is noted that the lowest range pass in the analysis filter bank 30 proves a filter corresponding to a scaling function, whilst other passes prove filters equivalent to wavelet functions.

Next, complete re-synthesis conditions, which prove crucial in constructing a band-splitting filter bank, are explained.

As stated in the above work, the band-splitting encoding, as a typical application of the filter bank, is in need of a filter bank which is able not only to band-split signals but also to re-construct and restore original signals from the band-split signals.

The complete re-synthesis conditions may be expressed by the following equations (5) and (6):

$$H_0(-z)F_0(z)+H_1(-z)F_1(z)=0 \quad (5)$$

$$H_0(z)F_0(z)+H_1(z)F_1(z)=2z^{-L} \quad (6)$$

Here, the fact that the following equations (7), (8):

$$F_0(z)=H_1(-z) \quad (7)$$

$$F_1(z)=-H_0(-z) \quad (8)$$

meet the above equation (5) is exploited.

Substituting the equations (7), (8) into the above equation (6), the following equation (9):

$$H_0(z)H_1(-z)-H_1(z)H_0(-z)=2z^{-L} \quad (9)$$

is obtained.

Thus, the complete re-synthesis conditions may be expressed by a function solely of $H_0(z)$ and $H_1(z)$. It is now assumed that the two-stage splitting analysis filter bank shown in FIG. 1 meets the complete re-synthesis conditions. First, substitution of the equations (5) and (6) into the equation (1) gives the following equation (10):

$$Y(z)=\tfrac{1}{2}[H_0(z)H_1(-z)H_1(z)H_0(-z)]X(z) \quad (10).$$

Substitution of the above equation (9) into the above equation (10) gives the following equation (11):

$$Y(z)=z^{-L}X(z) \quad (11)$$

That is, if the two-stage splitting analysis filter bank, shown in FIG. 1, meets the complete re-synthesis conditions, such a filter bank simply represents a delay system. Thus filter bank is termed a complete re-synthesis filter bank.

Based on the foregoing general explanation of the band-splitting filter bank, the present invention will now be explained specifically.

First, the processing for determining the two-stage splitting analysis filter bank 10 in the two-stage splitting filter bank shown in FIG. 1 is explained. If this two-stage splitting analysis filter bank 10 is determined, it is tantamount to determining the low-pass analysis filter ($H_0(z)$) 11 and the high-pass analysis filter ($H_1(z)$) 12. These low-pass analysis filter ($H_0(z)$) 11 and high-pass analysis filter ($H_1(z)$) 12 are determined by a sequence of processing operations shown in FIG. 3.

Figure 3:
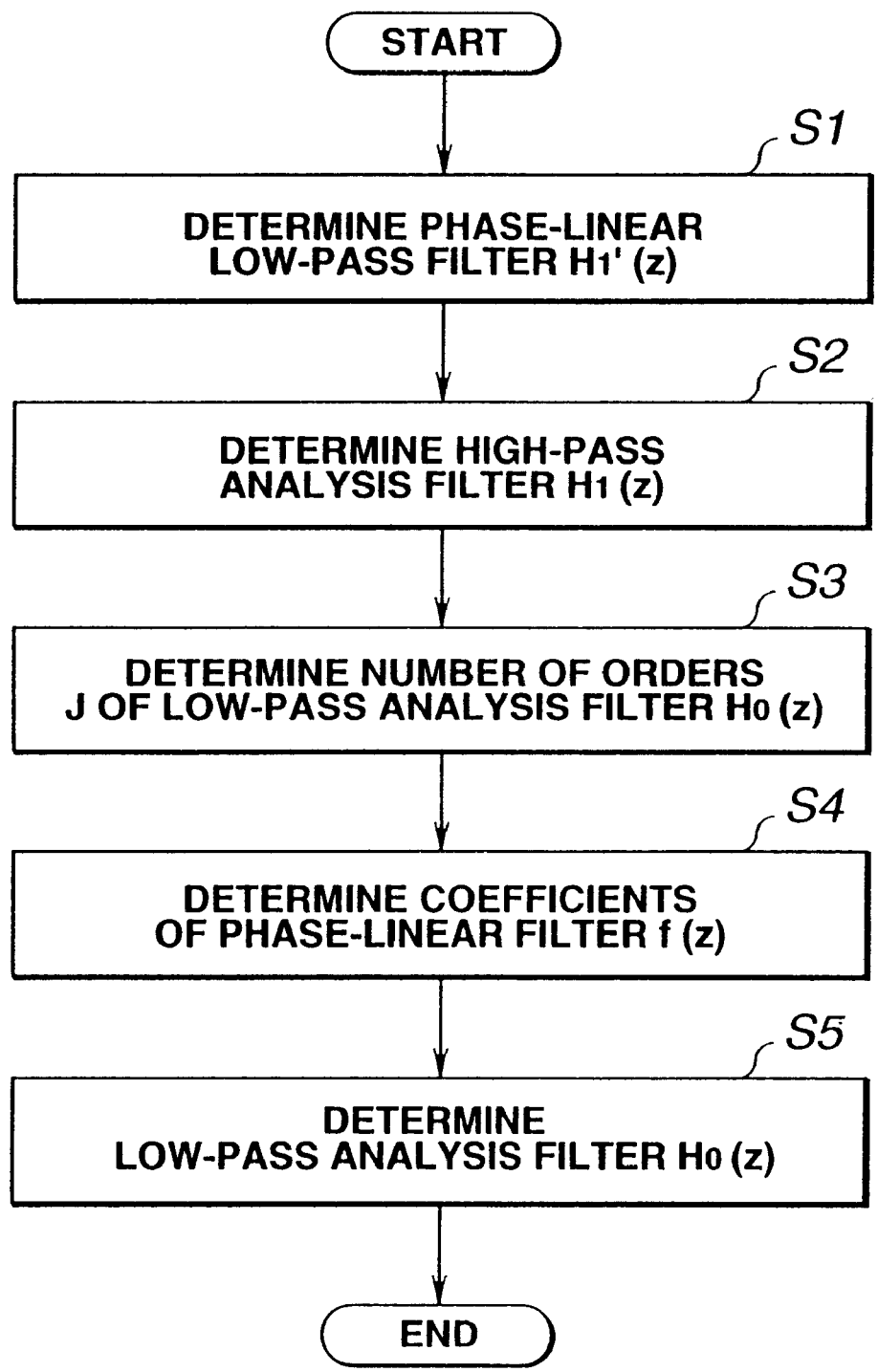
FIG. 3 is a flowchart for illustrating the sequence of operations in determining the 2-stage splitting filter bank shown in FIG. 1.

First, for determining the high-pass analysis filter ($H_1(z)$) 12, as the half-band high-pass filter, at step S1, in the two-stage splitting analysis filter bank 10, a phase-linear low-pass filter ($H_1'(z)$), as phase-linear low-pass filter means, is determined, as shown in FIG. 3.

The phase-linear filter and the half-band filter will be explained briefly.

The phase-linear filter first is explained. As for phase-linear characteristics, it is necessary to use a system having phase-linear characteristics, in case of doing picture processing or compression or rate conversion, as discussed in the above work. The phase-linear filter can usually be realized by an finite impulse response (FIR) filter. The necessary and sufficient condition for the FIR filter to have phase-linear characteristics is that an impulse response h(n) belongs to one of four cases shown in FIG. 4. That is, the necessary and sufficient condition for the FIR filter to have the phase-linear characteristics is that the impulse response belongs to one of the four cases shown in Table 1:

TABLE 1

| | |
|---|---|
| case 1 | filter tap length N is an odd number and even-number symmetry h(n) = (N − n − 1) holds |
| case 2 | filter tap length N is an even number and even-number symmetry h(n) = (N − n − 1) holds |
| case 3 | filter tap length N is an odd number and odd-number symmetry - h(n) = (N − n − 1) holds |
| case 4 | filter tap length N is an even number and odd-number symmetry - h(n) = (N − n − 1) holds |

On the other hand, the half-band filter is such a filter as has odd-number symmetrical characteristics of the passband and the stop band about $\omega=\pi/2$ as center. That is, the half-band filter is such a filter which satisfies the following relation if a z-function representation of the filter transfer function is H(z):

$$H(z)-H(-z)=z^{-L} \quad (12)$$

where L=(N−1)/2

The impulse response h(n)→in the half-band filter has characteristics as shown in FIG. 5B. That is, the impulse response h(n) in the half-band filter has characteristics in which the number N of impulse responses is odd and (N−1)/2 is also odd. Second, the impulse response h(n)→in the half-band filter has characteristics in which every odd-numbered h(n) is zero-valued except n (N−1)/2.

Referring to the two-stage splitting analysis filter bank 10, the above-mentioned phase-linear low-pass filter ($H_1'(z)$) is determined at step S1 in FIG. 2 to determine the high-pass analysis filter ($H_1(z)$) 12 which is such half-band high-pass filter. In the two-stage splitting analysis filter bank 10, the high-pass analysis filter ($H_1(z)$) 12 is determined at step 2.

In the two-stage splitting analysis filter bank 10, it is assumed that, with the number of dimensions being an odd number, the passband end frequency being optional and the stop band end frequency being n, the high-pass analysis filter ($H_1(z)$) 12 can be derived from the phase-linear low-pass filter ($H_1'(z)$) in accordance with the following equation (13):

$$H_1(z)=z^{-D}-H_1'(z^2) \quad (13).$$

Since the following equation (14):

$$H_1(z)-H_1(-z)=2z^{-D} \quad (14)$$

is readily obtained, using the above equation (13), the high-pass analysis filter ($H_1(z)$) 12 is simply a representation of time delay. The condition for a phase-linear half-band filter with the number of dimension of 2D is met.

If the phase-linear low-pass filter ($H_1'(z)$) is a low-pass filter, it is apparent that the above equation (13) shows the characteristics of a high-pass filter.

Thus, in the two-stage splitting analysis filter bank 10, the phase-linear low-pass filter ($H_1'(z)$) is first determined, and subsequently the high-pass analysis filter ($H_1(z)$) 12 is determined.

In the two-stage splitting analysis filter bank 10, the low-pass analysis filter ($H_0(z)$) 11 then is derived at steps 3 to Script interpreter executing unit 5 from the thus obtained high-pass analysis filter ($H_1(z)$) 12.

In the two-stage splitting analysis filter bank 10, the low-pass analysis filter ($H_0(z)$) 11 is determined from the high-pass analysis filter ($H_1(z)$) 12, a phase-linear filter (f(z)), as newly designed phase-linear filter means, and from an initial solution $H_0'(z)$ of the low-pass analysis filter ($H_0(z)$) 11, using, for example, the following equation (15):

$$H_0(z)=H_0'(z)z^{-J}+f(z)H_1(z) \quad (15).$$

Although the initial solution $H_0'(z)$ may be arbitrarily set, it is set here that $H_0'(z)=1$ for simplicity. Meanwhile, if this initial solution $H_0'(z)$ is substituted into the above equation (9), it becomes apparent that there exists a phase-linear low-pass filter ($H_1'(z)$) satisfying the following equation (16):

$$H_1'(-z)-H_1'(z)=2z^{-L} \quad (16).$$

Thus, the above equation (15) is rewritten to $$H_0(z)=z^{-J}+f(z)H_1(z) \quad (17).$$

It is noted that the first condition for the low-pass analysis filter ($H_0(z)$) 11 and the high-pass analysis filter ($H_1(z)$) 12 to represent a phase-linear filter bank satisfying the complete re-synthesis conditions is that the phase-linear filter (f(z)) is of a 2K dimension, K being an arbitrary odd number, and is the phase-linear filter of the case 2 of Table 1, with the number of dimensions being odd and even-symmetrical. On the other hand, the second condition is that the number of dimensions J of the low-pass analysis filter (H0(z)) 11 is as indicated in the following equation (18):

$$J=(2D+2K)/2 \quad (18).$$

It is seen from the foregoing that, by determining the phase-linear filter (f(z)) and the number of dimensions J, satisfying the first and second conditions, the low-pass analysis filter ($H_0(z)$) 11 can be determined in the two-stage splitting analysis filter bank 10. That is, in the two-stage splitting analysis filter bank 10, the number of dimensions J is determined at step 3 and the coefficients of the phase-linear filter (f(z)) are determined at step S4. In the two-stage splitting analysis filter bank 10, the low-pass analysis filter ($H_0(z)$) 11 is determined at step Script interpreter executing unit 5, using the high-pass analysis filter ($H_1(z)$) 12, phase-linear filter ($f(z)$) and the initial solution $H_0'(z)$.

By performing the sequence of processing operations, the low-pass analysis filter ($H_0(z)$) 11 and the high-pass analysis filter ($H_1(z)$) 12 are determined in the two-stage splitting analysis filter bank 10. This two-stage splitting analysis filter bank 10 may be used as the analysis filter bank 30 shown in FIG. 2A. The analysis filter bank 30, thus designed, can be used for wavelet splitting by hierarchically splitting the low frequency components into two frequency bands.

The two-stage synthesis filter bank 20, which is a decoding side counterpart of the encoding side two-stage splitting analysis filter bank 10 in the two-stage splitting analysis filter bank, is automatically determined when the two-stage splitting analysis filter bank 10 is determined.

Determining the two-stage synthesis filter bank 20 is tantamount to determining the low-pass synthesis filter ($F_0(z)$) 23 and the high-pass synthesis filter ($F_1(z)$) 24.

That is, in determining the two-stage synthesis filter bank 20, the following equations (19) and (20):

$$F_0(z)=H_1(-z) \qquad (19)$$

$$F_1(z)=-H_0(-z) \qquad (20)$$

represented by the above-mentioned low-pass analysis filter ($H_0(z)$) 11 and high-pass analysis filter ($H_1(z)$) 12 are given as conditions for the two-stage splitting analysis filter bank to satisfy the complete re-synthesis conditions.

In this manner, in the two-stage synthesis filter bank 20, the low-pass synthesis filter ($F_0(z)$) 23 and the high-pass synthesis filter ($F_1(z)$) 24 are uniquely determined in actuality by the above equations (19) and (20).

Of course, the low-pass synthesis filter ($F_0(z)$) 23 and the high-pass synthesis filter ($F_1(z)$) 24 correspond to the above-mentioned low-pass analysis filter ($H_0(z)$) 1] and the high-pass analysis filter ($H_1(z)$) 12, respectively.

The two-stage synthesis filter bank 20 can thus be designed easily along with the two-stage splitting analysis filter bank 10. The two-stage synthesis filter bank 20, thus designed, can be recursively applied to the low frequency components to perform wavelet synthesis.

A second embodiment of the present invention is now explained with reference to FIGS. 6 to 8. Here, the processing for designing the low-pass analysis filter (H0(z)) 11 and the high-pass analysis filter ($H_1(z)$) 12, described above by way of the first embodiment, and which is developed to an integer coefficient type wavelet transform employing lifting means, is explained.

In this case, the processing sequence shown in FIG. 3is performed in the two-stage splitting analysis filter bank 10 to determine the low-pass analysis filter ($H_0(z)$) 11 and the high-pass analysis filter ($H_1(z)$) 12.

First, in the two-stage splitting analysis filter bank 10, a phase-linear low-pass filter ($H_1'(z)$) is determined, using the following equation (21):

$$H_1'(z)=(1+z^{-1})/2 \qquad (21).$$

Then, in the two-stage splitting analysis filter bank 10, the above equation (21) is substituted into the equation (13), at step S2, to determine the high-pass analysis filter ($H_1'(z)$) 12 in accordance with the following equation (22):

$$H_1(z)=(-1+2z^{-1}-z^{-2})/2 \qquad (22).$$

In the two-stage splitting analysis filter bank 10, the phase-linear filter ($f(z)$) is given, at steps S3 and S4, as a solution satisfying the first and second conditions for the low-pass analysis filter ($H_0(z)$) 11 and the high-pass analysis filter ($H_1(z)$) 12 to satisfy the complete re-synthesis conditions, in accordance with the following equation (23):

$$f(z)=(1+z^{-2})/2 \qquad (23).$$

Since the number of dimensions D of the phase-linear low-pass filter ($H_1'(z)$)=1, and the number of dimensions of the phase-linear filter ($f(z)$) is 2K=2 (K=1), the number of dimensions J of the low-pass analysis filter ($H_0(z)$) 11 is J=2.

Thus, in the two-stage splitting analysis filter bank 10, if these values are substituted at step Script interpreter executing unit 5 into the above equation (17), and adjusted, the low-pass analysis filter ($H_0(z)$) 11, expressed by the following equation (24):

$$H_0(z)=(-1+2z^{-1}+2z^{-2}+2z^{-3}+2z^{-3}-z^{-4})/4 \qquad (24)$$

is obtained.

It is seen from the equations (22) and (24) that the high-pass analysis filter ($H_1(z)$) 12 and the low-pass analysis filter ($H_0(z)$) 11 are evidently filters having integer coefficients.

In this manner, in the two-stage splitting analysis filter bank 10, the low-pass analysis filter ($H_0(z)$) 11 and the high-pass analysis filter ($H_1(z)$) 12, having integer coefficients, are determined.

The processing for constructing an integer coefficient filter employing lifting means is now explained.

Figure 6:
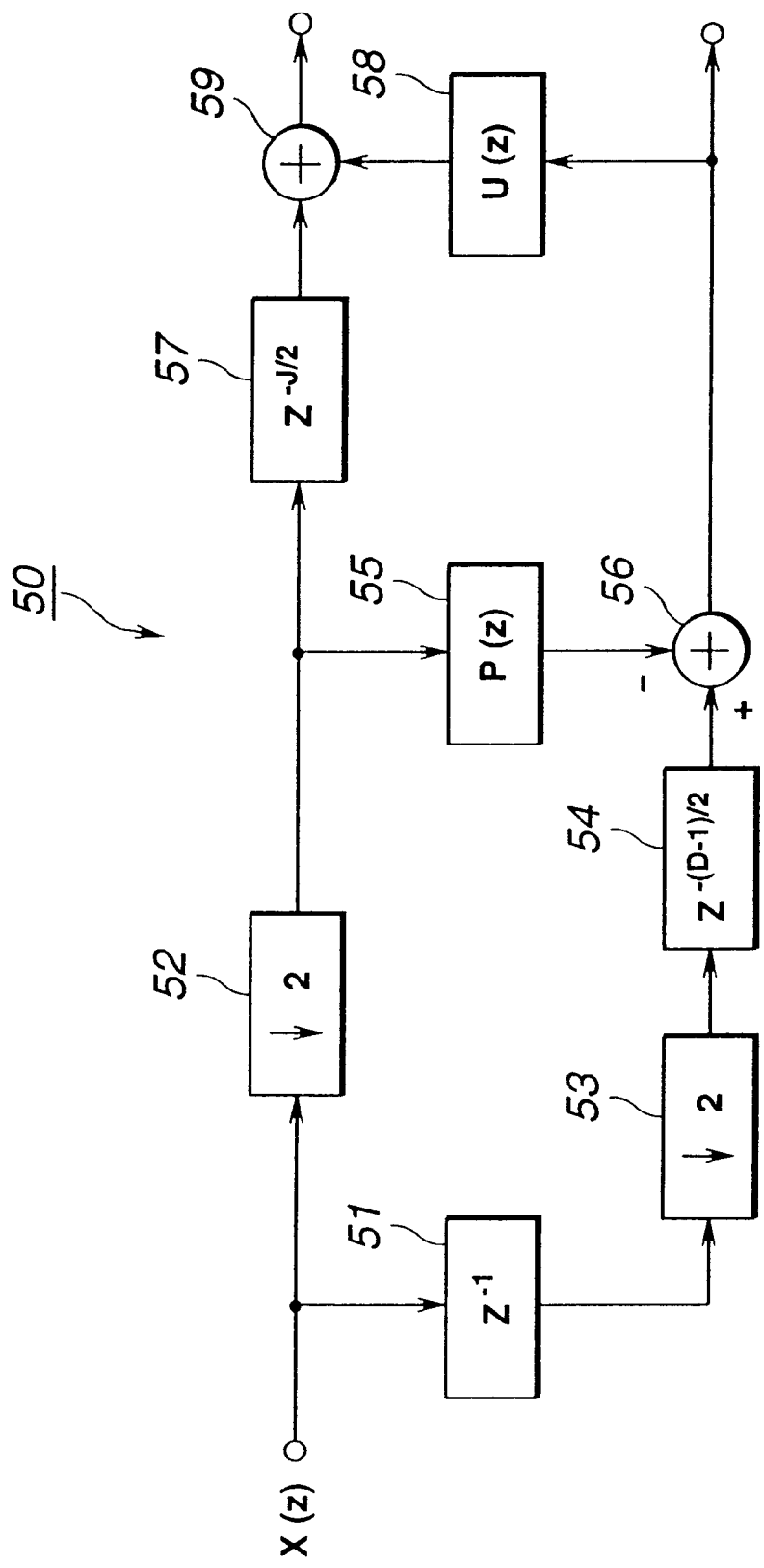
FIG. 6 is a block diagram for illustrating of a two-stage splitting analysis filter bank by the lifting structure, shown as embodying the present invention.

Referring to FIG. 6, a two-stage splitting analysis filter bank (analyzer) 50 includes a delay 51, as first delay means for delaying the input signal X(z) by time 1, and a downsampler 52, as first downsampling means for downsampling the input signal X(z) by ½. The two-stage splitting analysis filter bank (analyzer) 50 also includes a downsampler 53, as second downsampling means for downsampling a signal, delayed by time 1 from the input signal X(z) by the delay 51, by ½, and a delay unit 54, as second delay means for delaying an odd-component signal, as a second signal from the downsampler 53, by time (D−1)/2. The two-stage splitting analysis filter bank (analyzer) 50 also includes a predicting filter (P(z)) 55, as prediction filter means, fed with an even-component signal, as a first signal from the downsampler 52, to generate a prediction signal, and a subtractor 56, as subtraction means for taking a difference between the odd-component signal delayed by the delay unit 54 by time (D−1)/2 and the prediction signal from the predicting filter (P(z)) 55. The two-stage splitting analysis filter bank (analyzer) 50 also includes a delay unit 57, as third delay means, for delaying the even-number component signal from the downsampler 52 by time J/2 and an updating filter (U(z)) 58 fed with the difference signal from the subtractor 56 to generate an updated signal. The two-stage splitting analysis filter bank (analyzer) 50 finally includes an adder 59, as suiting means, for summing the even-number component signal delayed by time J/2 by the delay unit 57 and the updated signal from the updating filter (U(z)) 58.

This two-stage splitting analysis filter bank (analyzer) 50 samples the even-numbered component signal and the odd-numbered component signal from the input signal X(z) and outputs a low-range output signal, as an even-number component output signal, from the adder 59, while outputting a high-range output signal, as an odd-number component output signal.

Figure 7:
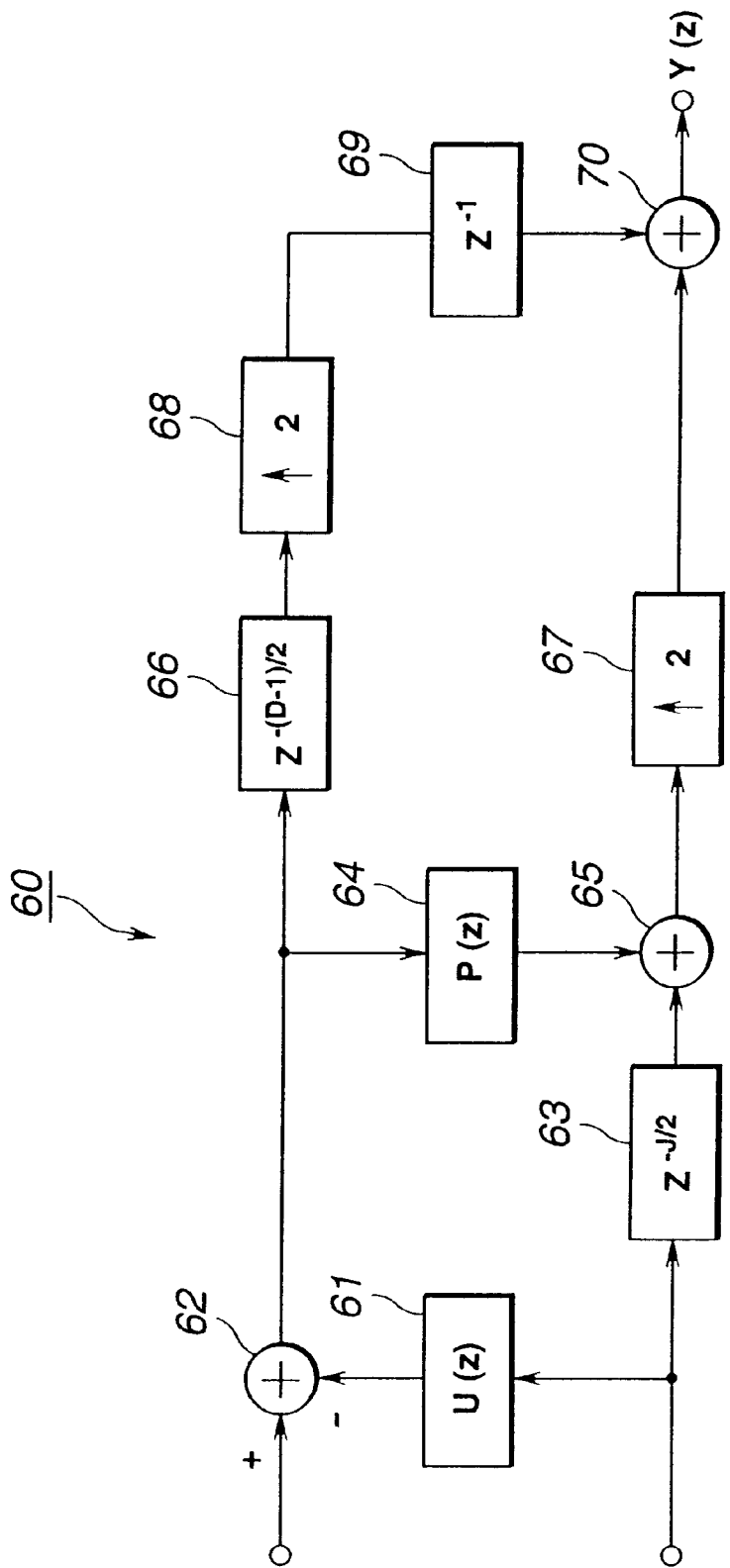
FIG. 7 is a block diagram for illustrating of a two-stage splitting synthesis filter bank by the lifting structure, shown as embodying the present invention.

On the other hand, a two-stage splitting synthesis filter bank (synthesizer) 60 by the lifting configuration includes various components equivalent to those of the two-stage splitting analysis filter bank (analyzer) 50, as shown in FIG. 7. That is, the two-stage splitting synthesis filter bank (synthesizer) 60 includes an updating filter (U(z)) 61, as updating filter means, fed with high range component signal, as odd-numbered component, to generate an updated signal, and a subtractor 62, as subtraction means, for taking a difference between a low range component output signal, as an even numbered component, and an updated signal from the updating filter (U(z)) 61. The two-stage splitting synthesis filter bank (synthesizer) 60 also includes a delay unit 63, as first delay means, for delaying the high range component output signal by time J/2, and a prediction filter (P(z)) 64, fed with a difference signal between a difference signal from the subtractor 62 to generate a prediction signal. The two-stage splitting synthesis filter bank (synthesizer) 60 also includes an adder 65, as first summing means, for suiting a high range output signal delayed by J/2 by the delay unit 63 to the prediction signal from the prediction filter (P(z)) 64, and a delay unit 66, as second delay means, for delaying the difference signal from the subtractor 63 by (D−1)/2. The two-stage splitting synthesis filter bank (synthesizer) 60 also includes an upsampler 67, as first upsampling means, fed with the sum signal from the adder 65 as an input to upsample the sum signal by 2, and an upsampler 68, as second upsampling means, fed with the difference signal, delayed by (D−1)/2 by the delay unit 66 to upsample the delayed signal by two. The two-stage splitting synthesis filter bank (synthesizer) 60 finally includes a delay unit 69, as third delay means, for delaying the upsampled low-range signal from the upsampler 68 by time 1, and an adder 70, as second summing means, for summing the upsampled high-range signal from the upsampler 67 to the upsampled low range signal delayed by time 1 by the delay unit 69.

In the present two-stage splitting synthesis filter bank (synthesizer) 60, the updating filter (U(z)) 61 and the prediction filter (P(z)) 64 are constructed equivalently to the updating filter (U(z)) 58 and the predicting filter (P(z)) 55 of the two-stage splitting analysis filter bank (analyzer) 50. Thus, the two-stage splitting synthesis filter bank (synthesizer) 60 has the function of restoring the low-range component output signal and the high-range component output signal, obtained on splitting by the two-stage splitting analysis filter bank (analyzer) 50, to an output signal Y(z) equivalent to the original input signal X(z).

Also, if the two-stage splitting analysis filter bank (analyzer) 50 and the two-stage splitting synthesis filter bank (synthesizer) 60 are directly connected to each other, the resulting system at all times represents simply a delaying system, without regard to particular values of the predicting filters (P(z)) 55, 64 and the updating filters (U(z)) 58, 61. That is, in the two-stage splitting analysis filter bank, complete re-synthesis can be realized easily based on this lifting configuration.

Meanwhile, the two-stage splitting analysis filter bank (analyzer) 50 of the lifting configuration, shown in FIG. 6, is able to assume the expression equivalent to the two-stage splitting analysis filter bank 10 having the low-pass analysis filter ($H_0(z)$) 11 and the high-pass analysis filter ($H_1(z)$) 12 shown in FIG. 1.

That is, if the two-stage splitting analysis filter bank (analyzer) 50 is modified to the two-stage splitting analysis filter bank 10, the high-pass analysis filter ($H_1(z)$) 12 and the low-pass analysis filter ($H_0(z)$) 11 are represented by the following equations (25), (26), respectively:

$$H_1(z) = -P(z^2) + z^{-D} \tag{25}$$

$$H_0(z)z^{-J} + U(z^2)\{-P(z^2) + z^{-D}\} = z^{-J} + U(z^2)H_1(z) \tag{26}$$

If now the equations (25), (26) are compared to the equations (13) and (17), the following equations (27) and (28):

$$P(z) = H_1'(z) \tag{27}$$

$$U(z^2) = f(z) \tag{28}$$

are derived.

Therefore, in the two-stage splitting analysis filter bank (analyzer) 50, it is seen that the transfer functions P(z), U(z) of a filter in the lifting configuration can be immediately determined by determining the transfer function $H_1'(z)$ of the phase-linear low-pass filter and the transfer function f(z) of the phase-linear filter.

Figure 8:
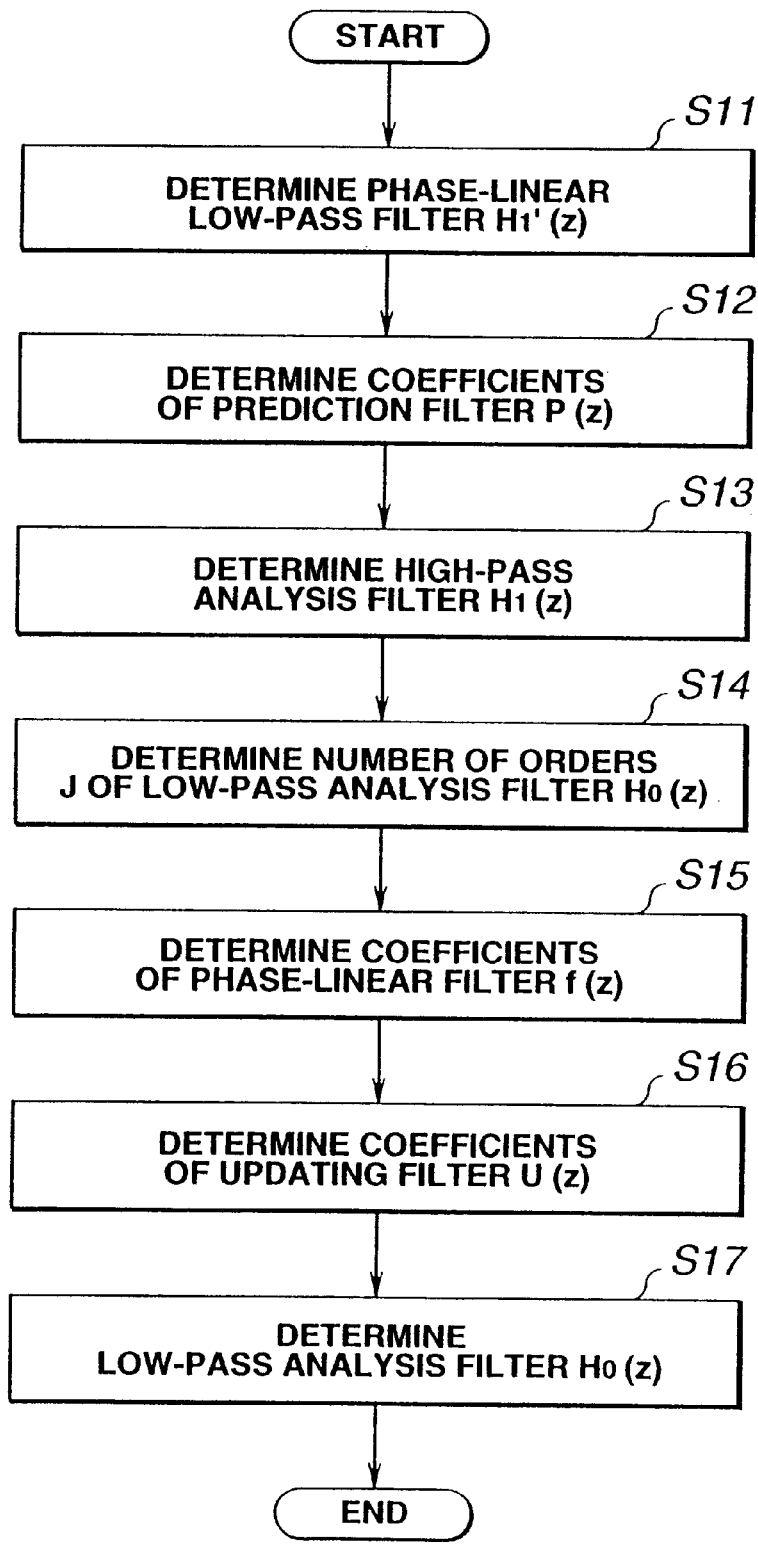
FIG. 8 is a flowchart for illustrating the sequence of operations in determining the two-stage splitting analysis filter bank by the lifting structure shown in FIG. 6.

Based on the foregoing, the two-stage splitting analysis filter bank (analyzer) 50 of the integer coefficient type, assuming the representation equivalent to that of the two-stage splitting analysis filter bank 10, is determined by the sequence of operations shown in FIG. 8.

Thus, in the two-stage splitting analysis filter bank (analyzer) 50, if the phase-linear low-pass filter ($H_1'(z)$) is determined using the above equation (21) at step S11, using the above equation (21), the coefficients of the predicting filter (P(z)) 55 are determined at step S12, using the above equation (27).

Then, in the two-stage splitting analysis filter bank (analyzer) 50, the equation (21) is substituted into the equation (13) at step S13 to determine the high-pass analysis filter ($H_1(z)$) 12 by the above equation (22).

Also, in the two-stage splitting analysis filter bank (analyzer) 50, the number of dimensions J of the low-pass analysis filter ($H_0(z)$) 11 is determined, while the phase-linear filter (f(z)) is given in accordance with the equation (23), at steps S14 and S15, as a solution satisfying the first and second conditions for the low-pass analysis filter ($H_0(z)$) 11 and the high-pass analysis filter ($H_1(z)$) 12 to represent a phase-linear filter bank meeting the complete re-synthesis conditions.

In the two-stage splitting analysis filter bank (analyzer) 50, if the coefficients of the phase-linear filter (f(z)) are determined, the coefficients of the updating filter (U(z)) 58 are determined at step S16.

In the two-stage splitting analysis filter bank (analyzer) 50, the low-pass analysis filter ($H_0(z)$) 11 shown by the above equation (24) is obtained at step S17.

By performing the above-described sequence of operations, in the two-stage splitting analysis filter bank (analyzer) 50, the predicting filter (P(z)) 55 and the updating filter (U(z)) 58 can be determined in the process of determining the two-stage splitting analysis filter bank 10, equipped with the low-pass analysis filter ($H_0(z)$) 11 and the high-pass analysis filter ($H_1(z)$) 12 having integer coefficients, thus assuring a representation equivalent to the two-stage splitting analysis filter bank 10. With the two-stage splitting analysis filter bank (analyzer) 50, thus designed, integer coefficient type wavelet splitting can be realized by two-stage splitting filtering the low range components. Of course, in the two-stage splitting analysis filter bank (analyzer) 50, if the low range components are configured in plural stages, as in the analysis filter bank 30 shown in FIG. 2A, the low-range components can be constructed in plural stages to realize hierarchical two-stage splitting filtering to effect integer coefficient type wavelet splitting.

Of course, the two-stage splitting synthesis filter bank (synthesizer) 60, associated with the two-stage splitting analysis filter bank (analyzer) 50, is uniquely determined if the two-stage splitting analysis filter bank (analyzer) 50 is determined.

In this manner, the two-stage splitting synthesis filter bank (synthesizer) 60, similarly to the two-stage splitting analysis filter bank (analyzer) 50, can be designed easily. The two-stage splitting synthesis filter bank (synthesizer) 60, thus designed, assumes a representation equivalent to the two-stage synthesis filter bank 20. The low-range components can be recursively processed by the two-stage splitting synthesis filter bank 60 to realize wavelet synthesis.

A third embodiment of the present invention is now explained. Here, the processing of actually determining the number of orders or coefficients of the respective filters, such as the low-pass analysis filter (H0(z)) 1, explained in connection with the first and second embodiments, is explained.

It is now assumed that the number of orders of the phase-linear low-pass filter ($H_1'(z)$) is D, the number of orders of the phase-linear filter (f(z)) is 2K, and the number of orders of the initial solution $H_0'(z)$ of the low-pass analysis filter ($H_0(z)$) 11, set to 1 for simplicity, is set to 1. The numbers of orders of the high-pass analysis filter ($H_1(z)$) 12 and the low-pass analysis filter ($H_0(z)$) 11 are expressed by the following equations (29) and (30), respectively:

$$\text{number of orders of } H_1(z) = 2D(\because\text{equation (13)}) \tag{29}$$

$$\text{number of orders of } H_0(z) = \max(2D+2K, I+D+K) \tag{30}$$

If the initial solution of the low-pass analysis filter ($H_0(z)$) 11 is set to 1, as described above, the number of orders of the low-pass analysis filter ($H_0(z)$) 11 is 2D+2K by the above equation (30).

These straightforwardly indicate that there exists the degree of freedom in designing a filter.

The processing for determining the number of orders of the filters or coefficients is specifically explained. First, if the number of orders of the high-pass analysis filter ($H_1(z)$) 12 in the above equation (29) is set to 2 (D=1), the number of orders of the phase-linear low-pass filter ($H_1'(z)$) is 1. Therefore, there is no degree of freedom, such that the phase-linear low-pass filter ($H_1'(z)$) is automatically represented by the following equation (31):

$$H_1'(z) = (1+z^{-1})/2 \tag{31}$$

If the above equation (31) is substituted into the equation (13), and adjusted, the following equation (32):

$$H_1(z) = (-1+2z^{-1}-z^{-2})/2 \tag{32}$$

Also, if the initial solution $H_0'$ of the low-pass analysis filter ($H_0(z)$) 11 is set to 1, the number of orders of the filter is 1, so that, from the above equation (30), the number of orders of the low-pass analysis filter ($H_0(z)$) 11 is 2+2K. Thus, if the number of orders of the low-pass analysis filter ($H_0(z)$) 11 is 4, K=1 automatically, so that the number of orders of the phase-linear filter (f(z)) is 2 and hence there is no degree of freedom. Here, the transfer function of the phase-linear filter (f(z)) is set as shown by the following equation (33):

$$f(z) = (1+z^{-2})/4 \tag{33}$$

If the equation (33) is substituted into the equation (17), and adjusted, the following equation (34) is readily obtained:

$$H_0(z) = (-1+2z^{-1}+6z^{-2}+2z^{-3}-z^{-4})/2^3 \tag{34}$$

From the foregoing, filter coefficients shown by the following equations (35), (36):

$$P = [1, 1]/2 \tag{35}$$

$$U = [1, 1]/4 \tag{36}$$

are obtained, in consideration of the relation among the equations (27), (28), (31) and (33).

Meanwhile, the notation used in the above equations (35) and (36) indicates that the coefficients of $z^0$ and $z^1$ of the predicting filter (P(z)) 55 are both 1, with the coefficients of $z^0$ and $z^1$ of the updating filter (U(z)) 58 being both 1. This filter corresponds to the filter coefficients of [5×3] known in the Joint photographic Experts Group (JPEG)-2000.

Meanwhile, there has been no alternative in determining the phase-linear filter (f(z)). If, for example, the number of orders of the low-pass analysis filter ($H_0(z)$) 11 is set to 2+2K=12, K=5. At this time, the odd-numbered coefficients of the phase-linear filter (f(z)) are 0 and even-symmetrical, the phase-linear filter (f(z)) is expressed by the following equation (37):

$$f(z) = (a_0 + a_2 z^{-2} + a_2 z^{-4} + a_0 z^{-6})/2^k \tag{37}$$

If, in order to set the coefficient in the above equation (37), the dc gain of the phase-linear filter (f(z)) is limited to 1, the relation shown by the equation (38):

$$a_2 = 2^{k-1} - a_0 \tag{38}$$

There are a large number of coefficient groups satisfying the above equation (27). If, for example, the coefficient group is set to $a_0=1$, $a_2=63$ and k=7, the phase-linear filter (f(z)) is expressed by the following equation (39):

$$f(z) = (1 + 63z^{-2} + 63z^{-4} + z^{-6})/2^7 \tag{39}$$

The above equation (39) is substituted into the equation (17) to give the following equation (40):

$$H_0(z) = (-1+2z^{-1}-64z^{-2}+126z^{-3}+130z^{-4}+126z^{-5}-64z^{-6}2z^{-7}-z^{-8})/2^8 \tag{40}$$

wherein, since K=5 from 2K=10, J=D+K=6.

Therefore, the filter coefficients shown by the following equations (41) and (42):

$$P = [1, 1]/2 \tag{41}$$

$$U = [1, 63, 63, 1]/2^7 \tag{42}$$

are obtained, in consideration of the relation among the equations (27), (28), (31) and (39).

This filter is of a tap length of [9×3].

As another example, in the case of the high-pass analysis filter ($H_1(z)$) 12 and the low-pass analysis filter ($H_0(z)$) 11, shown in the following equations (43) and (44), filter coefficients of a filter of a tap length of [9×3] shown in the equations (45) and (46):

$$H_1(z) = (-1+2z^{-1}-z^{-2})/2 \tag{43}$$

$$H_0(z) = (-1+2z^{-1}-64z^{-2}+126z^{-3}+386z^{-4}+126z^{-5}-64z^{-6}+2z^{-7}-z^{-8})/2 \tag{44}$$

$$P = [1, 1]/2 \tag{45}$$

$$U = [1, 63, 63, 1]/2^8 \tag{46}$$

are obtained in similar manner.

As still another example, in the case of the high-pass analysis filter ($H_1(z)$) 12 and the low-pass analysis filter ($H_0(z)$) 11, shown in the following equations (47) and (48), filter coefficients of a filter of a tap length of [13×3] shown in the equations (49) and (50):

$$H_1(z) = (-1 + 2z^{-1} - z^{-2})/2 \qquad (47)$$

$$H_0(z) = (-1 + 2z^{-1} 4z^{-2} - 10z^{-3} - 31z^{-4} + 72z^{-7} - 31 z^{-8} - 10z^{-9} + 4z^{-10} + 2z^{-11} - z^{-12})/2^8 \qquad (48)$$

$$P[1, 1]/2 \qquad (49)$$

$$U = [1, -5, 36, 36, -5, 1]/2^7 \qquad (50)$$

are obtained in similar manner.

By increasing the number of orders of the phase-linear filter (f(z)) in this manner, that is by increasing the difference between the numbers of orders of the low-pass analysis filter ($H_0(z)$) 11 and the high-pass analysis filter ($H_1(z)$) 12, the degree of freedom is increased. Thus, by increasing the difference in the numbers of orders between the low-pass analysis filter ($H_0(z)$) 11 and the high-pass analysis filter ($H_1(z)$) 12, it is possible to design integer filter coefficients of a lifting configuration having an extremely large number of degrees of freedom. Of course, in the two-stage splitting analysis filter bank, constituted by the filters, designed in this manner, wavelet splitting becomes possible by hierarchically two-stage splitting and filtering the low frequency components, as in the analysis filter bank 30 shown in FIG. 2A.

The band splitting filter bank, embodying the present invention, as described above, enables wavelet transform, and splits the picture signals into plural bands, by way of performing transform. Thus, with the use of the band-splitting filter bank, picture compression and expansion can be performed efficiently. Practical examples of application of the present band-splitting filter bank include an electronic camera, portable moving body picture transmission/reception terminals or personal digital assistants (PDA), printers, companders for satellite or medical pictures, software modules thereof, games, companders for textures used in three-dimensional computer graphics (CG) or software modules thereof According to the present invention, the two-stage splitting analysis filter bank 10, constructed by the low-pass analysis filter ($H_0(z)$) 11 and the high-pass analysis filter ($H_1(z)$) 12, or the two-stage synthesis filter bank 20, constructed by the low-pass synthesis filter ($F_1(z)$) 23 and the high-pass synthesis filter ($F_1(z)$) 24, shown as specified components of the band-splitting filter bank, can be constructed efficiently.

Also, in accordance with the present invention, the two-stage splitting analysis filter bank 10 or the two-stage synthesis filter bank 20 can easily be modified to the two-stage splitting analysis filter bank (analyzer) 50 or two-stage splitting synthesis filter bank (synthesizer) 60 of the lifting configuration.

Moreover, according to the present invention, the predicting filters (P(z)) 55, 64 or the updating filters (U(z)) 58, 61, required in the lifting configuration, can be found in the course of determining the low-pass analysis filter ($H_0(z)$) 11 and high-pass analysis filter ($H_1(z)$) 12. Thus, filter characteristics which become effective in the lifting configuration can be taken into account at the outset in designing.

In addition, according to the present invention, the degree of freedom in determining the filter coefficients of the phase-linear filter (f(z)) is obtained by determining the difference in the number of orders between the low-pass analysis filter ($H_0(z)$) 11 and the high-pass analysis filter ($H_1(z)$) 12. Thus, according to the present invention, filters may be designed with wide variety of flexibility.

The present invention is not limited to the above-described embodiments without departing from the scope of the invention. For example, it may be applied to a band-splitting filter bank having plural stages of the two-stage splitting analysis filter banks.

What is claimed is:

1. A filter bank constructing method for constructing a splitting filter bank for splitting an input signal into a high frequency range and a low frequency range, comprising:
   determining low-pass analysis filter means, adapted for passing frequency components of said input signal not higher than a pre-set frequency, by high pass analysis filter means, adapted for passing frequency components of said input signal not lower than the pre-set frequency, and by phase-linear filter means having phase linear characteristics.

2. The filter bank constructing method according to claim 1
   wherein
   said high pass analysis filter means is determined by phase-linear low-pass filter means having an odd number of orders of the filter coefficients and an even-number symmetrical impulse response.

3. The filter bank constructing method according to claim 1
   wherein
   said phase-linear filter means has an odd number of orders of filter coefficients and an even-number symmetrical impulse response.

4. A method for constructing a splitting filter bank in which a first signal obtained on downsampling an input signal is inputted to prediction filter means, a second signal obtained on downsampling said input signal and a prediction signal generated by said prediction filter means are inputted to subtraction means to generate a difference signal which is outputted as a high range component output signal, an updated signal generated on inputting the difference signal to updating filter means is summed to said first signal by summing means to output the sum signal as a low range component output signal, comprising:
   determining said prediction filter means by phase-linear low-pass filter means having an odd number of orders of the filter coefficients and an even-number symmetrical impulse response; and
   determining said updating filter means by phase-linear filter means having linear phase characteristics.

5. The filter bank constructing method according to claim 4
   wherein
   the dc gain of said phase-linear filter is limited to 1.

6. A filter bank constructing method for constructing a synthesis filter bank which is fed with low-range signals and high-range signals split respectively by low-pass analysis filter means adapted for passing frequency components of original signals not higher than a pre-set frequency and by high-pass analysis filter means adapted for passing frequency components of the original signals not lower than a pre-set frequency, and which synthesizes the low-range signals and high-range signals, comprising:
   determining low-pass synthesis filter means, fed with said low-range signals and adapted for passing frequency components not higher than a pre-set frequency, by said high-pass analysis filter means; and
   determining high-pass synthesis filter means, fed with said high-range signals and adapted for passing frequency components not lower than a pre-set frequency, by said low-pass analysis filter means.

7. The filter bank constructing method according to claim 6 wherein
said low-pass analysis filter means is determined by said high-pass analysis filter means and phase-linear filter means having phase-linear characteristics.

8. The filter bank constructing method according to claim 6
wherein
said high-pass analysis filter means is determined by phase-linear low-pass filter means having an odd number of orders of filter coefficients and even-symmetrical impulse response.

9. The filter bank constructing method according to claim 6
wherein
said phase-linear filter means has an odd number of orders of filter coefficients and even-number symmetrical impulse response.

10. A filter bank constructing method for constructing a synthesis filter bank in which a low-range component output signal, obtained on splitting an original signal, and a high-range component output signal, obtained on splitting the original signal, are inputted to updating filter means, to yield an updated signal, which updated signal is inputted along with said low-range component output signal to subtraction means to yield a difference signal, which difference signal is inputted to prediction filter means to yield a prediction signal, which prediction signal and said high-range component output signal are summed together by first summing means to yield a sum signal, which sum signal is summed to said difference signal by second summing means and outputted as an output signal; said filter bank constructing method comprising:
determining said prediction filter means by phase-linear low-pass filter means having an odd number of orders of the filter coefficients and even-number symmetrical impulse response; and
determining said updating filter means by phase-linear filter means having phase-linear characteristics.

11. A filter bank apparatus for splitting an input signal into a high frequency range and a low frequency range, comprising:
low-pass analysis filter means for passing frequency components of said input signal not higher than a pre-set frequency; and
high pass analysis filter means for passing frequency components of said input signal not lower than the pre-set frequency;
said low-pass analysis filter means being determined by said high-pass analysis filter means and phase-linear filter means having phase-linear characteristics.

12. The filter bank apparatus according to claim 11
wherein
said high pass analysis filter means is determined by phase-linear low-pass filter means having an odd number of orders of the filter coefficients and an even-number symmetrical impulse response.

13. The filter bank apparatus according to claim 11
wherein
said phase-linear filter means has an odd number of orders of filter coefficients and an even-number symmetrical impulse response.

14. The filter bank apparatus according to claim 11
wherein
said input signal is a picture signal.

15. The filter bank apparatus according to claim 11 comprising:

first downsampling means for downsampling input low-range signals having passed through said low-pass analysis filter means; and
second downsampling means for downsampling input high-range signals having passed through said high-pass analysis filter means.

16. The filter bank apparatus according to claim 15 comprising:
a plurality of stages of said low-pass analysis filter means and said first downsampling means;
said low-range signals being hierarchically filtered to effect wavelet splitting of said input signal.

17. A filter bank apparatus for splitting an input signal into a low range and a high range, comprising:
prediction filter means for being fed with a first signal obtained on downsampling said input signal to generate prediction signals;
subtraction means for being fed with a second signal obtained on downsampling said input signal and with said prediction signal to yield a difference signal;
updating filter means for being fed with said difference signal to yield an updated signal; and
addition means for summing said updated signal and said first signal;
said prediction filter means being determined by phase-linear low-pass filter means having an odd number of orders of filter coefficients and an even-number symmetrical filter response;
said updating filter means being determined by phase-linear filter means having phase-linear characteristics.

18. The filter bank apparatus according to claim 17
wherein
the dc gain of said phase-linear filter is limited to 1.

19. The filter bank apparatus according to claim 17
wherein
said input signal is a picture signal.

20. The filter bank apparatus according to claim 17 comprising:
first downsampling means for downsampling said input signal to yield said first signal;
first delay means for delaying said input signal as an input for delaying said signal for a pre-set time;
second downsampling means for downsampling said signal, as an input, delayed by said first delaying means, to yield said second signal;
second delaying means for delaying said second signal, as an input, for a pre-set time; and
third delaying means for delaying said first signal, as an input, for a pre-set time.

21. A filter bank apparatus for synthesizing input low-range signals and input high-range signals, split from an original signal by a low-range analysis filter means adapted for passing frequency components of the original signal not higher than a pre-set frequency, and by high-range analysis filter means adapted for passing frequency components of the original signal not lower than the pre-set frequency, respectively, comprising:
low range synthesis filter means for passing frequency components of input low-range signals not higher than the pre-set frequency;
high range synthesis filter means for passing frequency components of input high-range signals not lower than the pre-set frequency; and
summing means for summing signals passed through said low range synthesis filter means and said high range synthesis filter means;

said low range synthesis filter means being determined by said high range analysis filter means;

said high range synthesis filter means being determined by said low range analysis filter means.

22. The filter bank apparatus according to claim 21 wherein
said low-pass analysis filter means is determined by said high-pass analysis filter means and phase-linear filter means having phase-linear characteristics.

23. The filter bank apparatus according to claim 21 wherein
said high pass analysis filter means is determined by phase-linear low-pass filter means having an odd number of orders of the filter coefficients and an even-number symmetrical impulse response.

24. The filter bank apparatus according to claim 21 wherein
said phase-linear filter means has an odd number of orders of filter coefficients and an even-number symmetrical impulse response.

25. The filter bank apparatus according to claim 21 wherein
an output signal of said summing means is a picture signal.

26. The filter bank apparatus according to claim 21 comprising:
first upsampling means for upsampling the low-range signals as an input; and
second upsampling means for upsampling the input high-range signals.

27. The filter bank apparatus according to claim 26 comprising:
a plurality of stages of said low-pass analysis filter means and said first upsampling means;
said low-range signals being recursively filtered and summed to a signal having passed through said high range synthesis filter means to effect wavelet synthesis.

28. A filter bank apparatus for synthesizing an input low range component signal and an input high range component signal, obtained on splitting an original signal, comprising:

updating filter means for being fed with said high range component output signal as an input and for generating an updated signal;

subtracting means for being fed with said low range component signal and said updated signal to generate a difference signal;

prediction filter means for being fed with said difference signal for generating a prediction signal;

first summing means for being fed with said prediction signal and said high range component output signal for generating a sum signal; and second summing means for being fed with said sum signal and said difference signal for summing said sum signal and said difference signal;

said prediction filter means being determined by phase-linear low-pass filter means having an odd number of orders of the filter coefficients and an even-number symmetrical impulse response;

said updating filter means being determined by phase-linear filter means having phase-linear characteristics.

29. The filter bank apparatus according to claim 28 wherein
an output signal of said summing means is a picture signal.

30. The filter bank apparatus according to claim 28 comprising:
first delay means for being fed with the high range component output signal as an input for delaying said signal for a pre-set time;
second delaying means for being fed with said difference signal as an input for delaying the signal for a pre-set time;
first upsampling means for being fed with said sum signal as an input for upsampling the signal;
second upsampling means for being fed with said signal delayed by said second delaying means for upsampling said delayed signal; and
third delaying means for being fed with said signal from said second upsampling means for delaying the signal for a pre-set time.

* * * * *

UNITED STATES PATENT AND TRADEMARK OFFICE
CERTIFICATE OF CORRECTION

PATENT NO.    : 6,553,396 B1                                                Page 1 of 1
DATED         : April 22, 2003
INVENTOR(S)   : Fukuhara et al.

It is certified that error appears in the above-identified patent and that said Letters Patent is hereby corrected as shown below:

<u>Title page,</u>
Item [73], should read:
-- [73]   Assignees:     Sony Corporation, Tokyo (JP)
                         Hitoshi Kiya, Tokyo (JP) --

Signed and Sealed this

Ninth Day of September, 2003

JAMES E. ROGAN
*Director of the United States Patent and Trademark Office*